(12) United States Patent
van den Oever et al.

(10) Patent No.: US 9,306,017 B2
(45) Date of Patent: Apr. 5, 2016

(54) BIPOLAR TRANSISTOR WITH LATERAL EMITTER AND COLLECTOR AND METHOD OF PRODUCTION

(75) Inventors: Léon C. M. van den Oever, Rosmalen (NL); Ray J. E. Hueting, Hengelo (NL)

(73) Assignee: EPCOS AG, Munich (DE)

( * ) Notice: Subject to any disclaimer, the term of this patent is extended or adjusted under 35 U.S.C. 154(b) by 15 days.

(21) Appl. No.: 13/474,605

(22) Filed: May 17, 2012

(65) Prior Publication Data

US 2012/0273760 A1  Nov. 1, 2012

Related U.S. Application Data

(63) Continuation of application No. PCT/EP2009/066364, filed on Dec. 3, 2009.

(51) Int. Cl.
*H01L 29/49* (2006.01)
*H01L 29/423* (2006.01)
*H01L 29/778* (2006.01)

(52) U.S. Cl.
CPC ...... *H01L 29/42316* (2013.01); *H01L 29/7787* (2013.01)

(58) Field of Classification Search
CPC .................. H01L 29/42316; H01L 29/7787
USPC .......... 257/557, 197, 477, 194, 474, E29.323, 257/24, 769, 22, 55, 76, 751, 750, 744, 745
See application file for complete search history.

(56) References Cited

U.S. PATENT DOCUMENTS

| | | | | |
|---|---|---|---|---|
| 5,148,245 A | * | 9/1992 | Takikawa et al. | 257/194 |
| 5,153,682 A | * | 10/1992 | Goto et al. | 257/194 |
| 5,567,961 A | * | 10/1996 | Usagawa et al. | 257/197 |
| 5,914,522 A | * | 6/1999 | Aiello et al. | 257/500 |
| 8,421,123 B2 | * | 4/2013 | Machida et al. | 257/195 |
| 8,969,881 B2 | * | 3/2015 | Briere et al. | 257/76 |
| 2004/0079971 A1 | * | 4/2004 | Taylor | 257/215 |
| 2005/0189561 A1 | | 9/2005 | Kinzer et al. | |
| 2006/0231861 A1 | * | 10/2006 | Akamatsu et al. | 257/192 |
| 2009/0008676 A1 | | 1/2009 | Sato | |
| 2009/0032820 A1 | * | 2/2009 | Chen | 257/76 |
| 2009/0159925 A1 | * | 6/2009 | Machida | 257/124 |
| 2009/0206363 A1 | | 8/2009 | Machida et al. | |
| 2009/0321787 A1 | * | 12/2009 | Murphy et al. | 257/194 |
| 2010/0252864 A1 | * | 10/2010 | Kawasaki | 257/194 |
| 2011/0254056 A1 | * | 10/2011 | Machida et al. | 257/195 |
| 2011/0320505 A1 | * | 12/2011 | Jung et al. | 707/812 |
| 2012/0043588 A1 | * | 2/2012 | Iwabuchi et al. | 257/194 |
| 2012/0145995 A1 | * | 6/2012 | Jeon et al. | 257/20 |

(Continued)

FOREIGN PATENT DOCUMENTS

| | | |
|---|---|---|
| CA | 1007762 A1 | 3/1977 |
| JP | 5016480 A | 2/1975 |
| JP | 50154073 A | 12/1975 |
| JP | 564274 A | 1/1981 |
| JP | 60120551 A | 6/1985 |
| JP | 63136574 A | 6/1988 |
| JP | 63213971 A | 9/1988 |
| WO | WO 2005/081768 A2 | 9/2005 |

(Continued)

*Primary Examiner* — Michael Shingleton
(74) *Attorney, Agent, or Firm* — Slater & Matsil, L.L.P.

(57) ABSTRACT

A bipolar transistor includes a substrate of semiconductor material, a high-mobility layer in the substrate, and a donor layer adjacent to the high-mobility layer. An emitter terminal forms an emitter contact on the donor layer, and a collector terminal forms a collector contact on the donor layer. A base terminal is electrically conductively connected with the high-mobility layer. The transistor can be produced in a HEMT technology or BiFET technology in GaAs.

28 Claims, 2 Drawing Sheets

(56) References Cited

U.S. PATENT DOCUMENTS

2013/0228788 A1* 9/2013 Yamamura .................. 257/76
2013/0240951 A1* 9/2013 Bedell et al. ................ 257/194
2013/0292699 A1* 11/2013 Ueno et al. .................. 257/76

FOREIGN PATENT DOCUMENTS

| WO | WO 2007/128075 A2 | 11/2007 |
| WO | WO 2010/046449 A1 | 4/2010 |
| WO | WO 2010/055102 A1 | 5/2010 |

* cited by examiner

US 9,306,017 B2

BIPOLAR TRANSISTOR WITH LATERAL EMITTER AND COLLECTOR AND METHOD OF PRODUCTION

This application is a continuation of co-pending International Application No. PCT/EP2009/066364, filed Dec. 3, 2009, which designated the United States and was published in English, which application is hereby incorporated herein by reference.

TECHNICAL FIELD

The invention relates to a bipolar transistor which can be used as a pnp bipolar transistor and can be realized in GaAs, especially in GaAs HEMT technology or GaAs BiFET technology.

BACKGROUND

A high electron mobility transistor, abbreviated HEMT, comprises a donor layer formed by a doped semiconductor layer, which may comprise n-doped GaAs or a compound of Ga, As and one or more further components like Al or In, particularly n-doped $Al_xGa_{1-x}As$, for example. The donor layer is arranged adjacent to undoped semiconductor material having a narrower energy band gap, which can be undoped GaAs, for example, or a compound of Ga, As and one or more further components. Because of the heterojunction between the semiconductor materials of different energy band gaps, a quantum well is formed in the undoped semiconductor material in the vicinity of the donor layer. Electrons supplied by the donor layer diffuse into the quantum well. The electrons cannot escape from the quantum well and form a two-dimensional electron gas. The lack of impurities causes a low resistance and a high electron mobility. The electrons are thus confined to a high-mobility layer, which can be used as a channel region of a field-effect transistor. A gate electrode is applied to the surface of the donor layer. Dual-gate HEMTs or multiple-gate HEMTs comprise separate contacts forming the gate electrode similar to dual-gate or multiple-gate MOSFETs.

A pseudomorphic HEMT or pHEMT combines semiconductor materials of different lattice constants. One of the layers, which may be the layer comprising the high-mobility layer, is made sufficiently thin to adapt its crystal lattice to the lattice of the adjacent layer. This allows a larger difference of the energy band gaps, because the materials are not restricted to their own bulk lattice constant.

WO 2007/128075 A2 describes a lateral pnp transistor on GaAs. Ohmic contacts between the metal of the emitter and collector contacts and the semiconductor layers are achieved by a high doping concentration of the semiconductor material.

WO 2005/081768 A2 describes Schottky barrier junctions used in HBT structures.

SUMMARY

In one aspect, the present invention provides a transistor that can be manufactured in a GaAs technology and used as a pnp transistor. Another aspect of the present invention provides a suitable method of production of such a transistor.

In one embodiment, a bipolar transistor comprises a substrate of semiconductor material, a high-mobility layer in the substrate, and a donor layer adjacent to the high-mobility layer. An emitter terminal forms an emitter contact on the donor layer, and a collector terminal forms a collector contact on the donor layer. A base terminal is electrically conductively connected with the high-mobility layer.

In an embodiment of the bipolar transistor, the high-mobility layer forms a quantum well.

In a further embodiment, the high-mobility layer comprises Ga and As and/or the donor layer comprises Ga and As.

In a further embodiment, the emitter terminal and the collector terminal are interdigitated.

In a further embodiment, the emitter terminal is at least partially surrounded by the collector terminal in a layer.

In a further embodiment, the emitter contact and/or the collector contact is a Schottky contact.

In a further embodiment, a base contact region of semiconductor material is arranged between the high-mobility layer and the base terminal. The base contact region is doped so that the base terminal forms an ohmic contact on the base contact region.

In a further embodiment, a base contact region is arranged between the high-mobility layer and the base terminal, the base terminal forming a Schottky contact on the base contact region.

In a further embodiment, a second base terminal is present. The emitter terminal and the collector terminal are arranged between the base terminals.

In a further embodiment, the donor layer has a donor concentration between $10^{14}$ cm$^{-3}$ and $10^{20}$ cm$^{-3}$.

In a further embodiment, the high-mobility layer is also provided as a channel layer of a HEMT, which is provided additionally to the bipolar transistor. The bipolar transistor and the HEMT can thus be integrated in the same semiconductor substrate, which may especially be GaAs.

A method of producing a transistor comprises the steps of forming an n-doped donor layer in or on a substrate of semiconductor material, so that a high-mobility layer is generated in the substrate adjacent to the donor layer. A metallization is applied to form a Schottky emitter contact and a Schottky collector contact on the doped layer and also to form a base terminal that is electrically conductively connected with the high-mobility layer.

In a variant of the method, a base contact region is arranged between the base terminal and the high-mobility layer. The base contact region is doped sufficiently highly so that the base terminal forms an ohmic contact to the base contact region. Instead, a Schottky contact is formed between the base terminal and the base contact region or directly between the base terminal and the donor layer.

In a further variant of the method, the emitter contact is formed by an emitter terminal and the collector contact is formed by a collector terminal, the emitter terminal and the collector terminal having the shape of the gate electrode of a dual-gate HEMT.

The method can be applied in a pHEMT technology in GaAs or in a BiFET technology in GaAs.

BRIEF DESCRIPTION OF THE DRAWINGS

These and other features of the invention will become apparent from the following detailed description in conjunction with the appended drawings.

Figure 1:
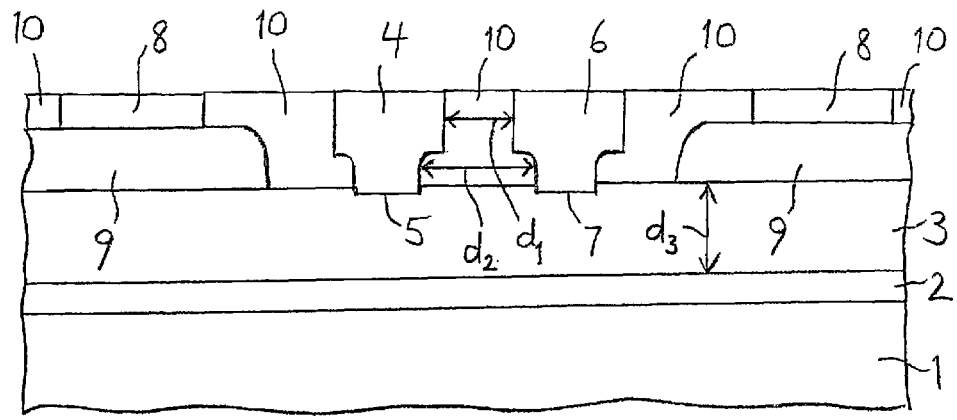
FIG. 1 shows a cross-section of an embodiment of the bipolar transistor.

The following reference numerals can be used in conjunction with the drawings:

1 substrate
2 high-mobility layer
3 donor layer
4 emitter terminal
5 emitter contact
6 collector terminal
7 collector contact
8 base terminal
9 base contact region
10 dielectric
d1 dimension
d2 dimension
d3 dimension

DETAILED DESCRIPTION OF ILLUSTRATIVE EMBODIMENTS

FIG. 1 shows a cross-section of an embodiment of the bipolar transistor according to the invention. A substrate 1 of semiconductor material can be GaAs, for example. A high-mobility layer 2 is formed in the substrate 1 adjacent to a donor layer 3, which extends to an upper surface of the semiconductor material. The donor layer 3 can be directly adjacent to the undoped semiconductor material of the high-mobility layer 2. In other embodiments, a thin layer or layer sequence can be present between the high-mobility layer 2 and the donor layer 3 in order to adapt different crystal lattices of these layers to one another. The donor layer 3 is n-doped, and the n-type impurity atoms or donors can have a concentration of typically $10^{17}$ cm$^{-3}$. The donor concentration is preferably in the range between $10^{14}$ cm$^{-3}$ and $10^{20}$ cm$^{-3}$. The donor layer 3 can be typically about 300 nm thick, for example, and this dimension $d_3$=300 nm is indicated in FIG. 1. The high-mobility layer 2 and the donor layer 3 can be formed according to a channel layer of a HEMT and an appertaining donor layer.

An emitter terminal 4 forms an emitter contact 5 on the donor layer 3. The emitter contact 5 can be a Schottky contact. A Schottky contact is formed by an application of a metallic emitter contact 4 on the relatively weakly doped semiconductor material of the donor layer 3. Accordingly, a collector terminal 6 forms a collector contact 7 on the donor layer 3. The collector terminal 6 can also be a metal, and the collector contact 7 can be a Schottky contact. The emitter terminal 4 and the collector terminal 6 can especially be formed in the manner of a gate electrode of a dual-gate pHEMT. The dimensions $d_1$ and $d_2$ indicated in FIG. 1 are typically $d_1$=1.0 µm and $d_2$=1.5 µm.

At least one base terminal 8 is provided lateral to the emitter terminal 4 and the collector terminal 6. The base terminals 8 are electrically conductively connected with the high-mobility layer 2. In order to provide ohmic contacts between the base terminals 8 and the semiconductor material, highly doped base contact regions 9 can be arranged between the base terminals 8 and the semiconductor material of the donor layer 3. In this way, the formation of Schottky contacts between the base terminals 8 and the semiconductor material is avoided. If no metal is used as the electrically conductive material of the base terminals 8, the base contact regions 9 are not necessary to prevent the formation of a Schottky contact. Instead, a base contact region 9 of doped or unintentionally doped semiconductor material may be arranged between the high-mobility layer 2 and the base terminal 8, the base terminal 8 forming a Schottky contact on the base contact region 9, so that its workfunction is higher than that of the emitter terminal 4. Base terminals may instead be applied directly on the high-mobility layer 2 or on the donor layer 3.

Although an application of one base terminal 8 would be sufficient, a structure having a double-sided base terminal 8, as shown in the cross-section of FIG. 1, is especially favorable. In this embodiment, contacts similar to the source and drain contacts of a HEMT structure are used as base terminals. The emitter terminal 4 and the collector terminal 6 are arranged between the two base terminals 8. The terminals 4, 6, 8 are separated from one another by a dielectric 10, which may be applied to planarize the surface of the device.

Figure 2:
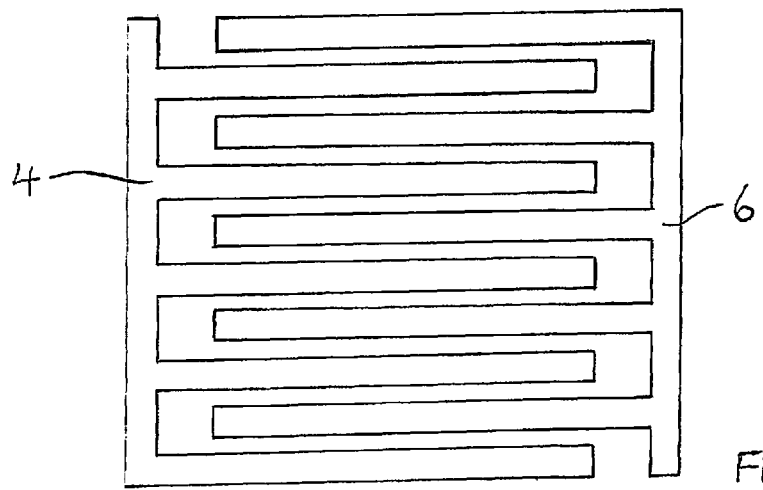
FIG. 2 shows a plan view of an arrangement of an emitter terminal and a collector terminal which are interdigitated.
Figure 3:
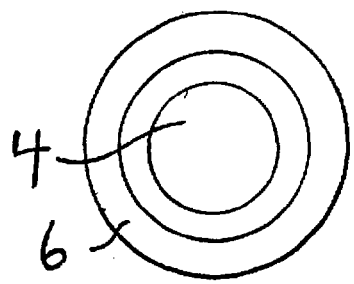
FIG. 3 shows a plan view of an arrangement of an emitter terminal and a collector terminal surrounding the emitter terminal.

Apart from the embodiment shown in FIG. 1, which is closest to the structure of a HEMT, other configurations comprising single or multiple bases and/or single or multiple emitters and/or single or multiple collectors are also possible. A configuration with interdigitated emitter and collector terminals 4, 6, as shown in a plan view in FIG. 2, is favorable because of an improved emitter and collector efficiency and a low series resistance.

Figure 4:
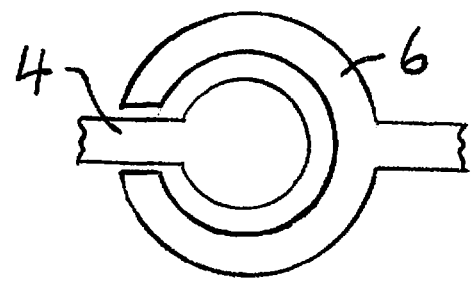
FIG. 4 shows a plan view of an arrangement of an emitter terminal and a collector terminal partially surrounding the emitter terminal.
Figure 5:
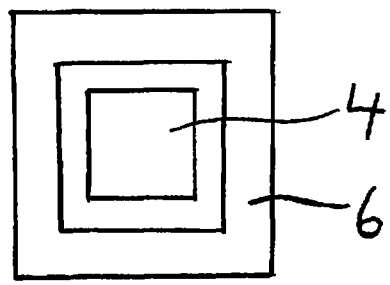
FIG. 5 shows a plan view of a further arrangement of an emitter terminal and a collector terminal surrounding the emitter terminal.
Figure 6:
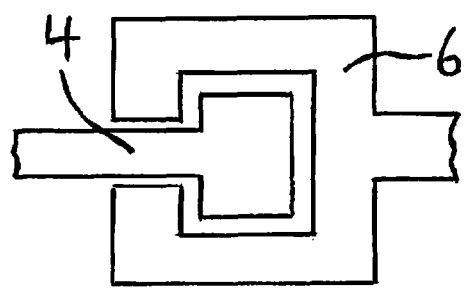
FIG. 6 shows a plan view of a further arrangement of an emitter terminal and a collector terminal partially surrounding the emitter terminal.

FIGS. 3 to 6 show plan views of further arrangements of the emitter and collector terminals 4, 6, in which the emitter terminal 4 is at least partially surrounded by the collector terminal 6 in a layer corresponding to the drawing plane. The emitter terminal 4 can be a point emitter with the collector terminal 6 around the emitter terminal as in FIG. 3. The emitter and collector terminals 4, 6 can be provided with lateral connecting terminals, the collector terminal 6 only partially surrounding the emitter terminal 4 in a layer corresponding to the drawing plane, as shown in FIG. 4. Instead of the circular shapes shown in FIGS. 3 and 4, other shapes of the emitter and collector terminals 4, 6 are possible, as shown in the examples of the plan views of FIGS. 5 and 6.

The emitter, base, and collector can be fabricated employing different metals with different workfunctions. This affects the Schottky junctions and thus the carrier transport and device characteristics. The highest current gain can be achieved when the base metal forms a Schottky contact in which the metal has a higher workfunction than that of the emitter contact. The collector contact can in this case be an ohmic contact, or the collector contact can be a Schottky contact which has a workfunction that is equal to or smaller than the workfunction of the emitter. Metals such as Ti, Pd, Au, and Ni, which are commonly used in GaAs processing, are suitable as well as other metals.

The described transistor can be manufactured in a process that is used for the production of HEMTs, especially in GaAs technology. The emitter terminal 4 and the collector terminal 6 can be formed by electrically conductive structures that are similar to a dual-gate electrode of a HEMT. The base terminals are arranged at positions which correspond to the positions of source and drain contacts of a HEMT. The bipolar transistor according to the invention can therefore be integrated in GaAs together with HEMTs and pHEMTs.

The lateral bipolar transistor comprising an n-doped donor layer functions as a pnp bipolar transistor. It provides p-type devices for GaAs technologies. The structure can also be applied in conjunction with other semiconductor materials, especially silicon.

What is claimed is:

1. A transistor, comprising:
   a substrate of semiconductor material;
   a high-mobility layer in the substrate;
   a donor layer adjacent to the high-mobility layer, the donor layer having a first surface opposite the donor layer from the high-mobility layer;
   an emitter terminal in direct contact with, and forming an emitter contact with, the first surface of the donor layer;
   a collector terminal in direct contact with, and forming a collector contact with the first surface of the donor layer; and
   a base terminal, which is electrically conductively connected with the high-mobility layer, wherein the base terminal is arranged outside a region extending between the emitter terminal and the collector terminal;
   wherein the emitter contact comprises a first metal forming a first Schottky contact;
   wherein the base terminal comprises a second metal forming a second Schottky contact;
   wherein the second metal has a higher work function that the first metal; and
   wherein the collector contact forms an ohmic contact.

2. The transistor of claim 1, wherein the high-mobility layer forms a quantum well.

3. The transistor of claim 1, wherein the high-mobility layer and/or the donor layer comprises Ga and As.

4. The transistor of claim 1, wherein the emitter terminal and the collector terminal are interdigitated.

5. The transistor of claim 1, wherein the emitter terminal is at least partially surrounded by the collector terminal in a layer.

6. The transistor of claim 1, wherein the base terminal forms the second Schottky contact on a base contact region arranged between the high-mobility layer and the base terminal.

7. The transistor of claim 1, further comprising a second base terminal disposed over and electrically conductively connected with the high-mobility layer, the emitter terminal and the collector terminal being arranged between the base terminal and the second base terminal.

8. The transistor of claim 1, wherein the donor layer has a donor concentration between $10^{14}$ cm$^{-3}$ and $10^{20}$ cm$^{-3}$.

9. The transistor of claim 1, wherein the high-mobility layer forms a channel layer of a further transistor.

10. The transistor of claim 9, wherein the further transistor comprises a HEMT.

11. The transistor of claim 7, wherein the second base terminal is electrically conductively connected with the high-mobility layer.

12. The transistor of claim 1, wherein the emitter contact comprises a Schottky emitter contact and the collector contact comprises a Schottky collector contact.

13. The transistor of claim 1, wherein different metals with different work functions are provided for the terminals;
   wherein the base terminal forms a Schottky contact in which the metal has a higher work function than a work function of the emitter contact.

14. The transistor of claim 1, wherein the collector contact is a Schottky contact having a work function that is equal to or smaller than a work function of the emitter contact.

15. A transistor, comprising:
   a substrate of semiconductor material;
   a high-mobility layer in the substrate;
   a donor layer adjacent to the high-mobility layer, the donor layer having a first surface opposite the donor layer from the high-mobility layer;
   an emitter terminal in direct contact with, and forming an emitter contact with, the first surface of the donor layer;
   a collector terminal in direct contact with, and forming a collector contact with, the first surface of the donor layer; and
   a base terminal, which is electrically conductively connected to the high-mobility layer, wherein the base terminal is arranged outside of a region extending between the emitter terminal and the collector terminal;
   wherein the emitter contact, the collector contact and the base terminal comprise different metals forming Schottky contacts and having different work functions;
   wherein the work function of the base terminal is higher than the work function of the emitter contact; and
   wherein the work function of the collector contact is smaller than the work function of the emitter contact.

16. The transistor of claim 15, wherein the high-mobility layer forms a quantum well.

17. The transistor of claim 15, wherein the high-mobility layer and/or the donor layer comprises Ga and As.

18. The transistor of claim 15, wherein the emitter terminal and the collector terminal are interdigitated.

19. The transistor of claim 15, wherein the emitter terminal is at least partially surrounded by the collector terminal in a layer.

20. The transistor of claim 15, further comprising a second base terminal disposed over and electrically conductively connected with the high-mobility layer, the emitter terminal and the collector terminal being arranged between the base terminal and the second base terminal.

21. The transistor of claim 15, wherein the base terminal forms a Schottky contact on a base contact region arranged between the high-mobility layer and the base terminal.

22. The transistor of claim 15, wherein the donor layer has a donor concentration between $10^{14}$ cm$^{-3}$ and $10^{20}$ cm$^{-3}$.

23. The transistor of claim 15, wherein the high-mobility layer forms a channel layer of a further transistor.

24. A method of producing the transistor of claim 1, the method comprising:
   forming the high-mobility layer in the substrate of semiconductor material;
   forming the donor layer adjacent to the high-mobility layer;
   forming the emitter terminal to form the emitter contact to the surface of the donor layer;
   forming the collector terminal to form the collector contact to the surface of the donor layer; and
   forming the base terminal.

25. A method of producing the transistor of claim 12, the method comprising:
   forming an n-doped donor layer such that the high-mobility layer is adjacent to the donor layer; and
   applying a metallization to form the Schottky emitter contact and the Schottky collector contact on the donor layer and to form the base terminal that is electrically conductively connected with the high-mobility layer.

26. The method of claim 25, further comprising:
   forming a base contact region, the base contact region being between the base terminal and the high-mobility layer; and
   forming an ohmic contact or a Schottky contact between the base terminal and the base contact region.

27. The method of claim 25, further comprising:
   forming the emitter terminal to provide the Schottky emitter contact and the collector terminal to provide the Schottky collector contact, the emitter terminal and the collector terminal being formed in the shape of a gate electrode of a dual-gate HEMT.

28. The method of claim 25, wherein the transistor is produced in a HEMT technology in GaAs or in a BiFET technology in GaAs.

\* \* \* \* \*